United States Patent [19]

Haken et al.

[11] Patent Number: 4,587,718

[45] Date of Patent: May 13, 1986

[54] PROCESS FOR FORMING TISI$_2$ LAYERS OF DIFFERING THICKNESSES IN A SINGLE INTEGRATED CIRCUIT

[75] Inventors: Roger A. Haken, Richardson, Tex.; Michael E. Alperin, Green Mountain Falls, Colo.; Chi K. Lau, Saratoga, Calif.

[73] Assignee: Texas Instruments Incorporated, Dallas, Tex.

[21] Appl. No.: 676,686

[22] Filed: Nov. 30, 1984

[51] Int. Cl.$^4$ .................................... H01L 21/285
[52] U.S. Cl. .................................... 29/571; 29/590; 29/577 C
[58] Field of Search ............... 357/67 S, 71 S, 59 P, 357/65; 148/1.5; 29/571

[56] References Cited

U.S. PATENT DOCUMENTS

| | | | |
|---|---|---|---|
| 3,274,670 | 9/1966 | Lepselter | 29/155.5 |
| 4,180,596 | 12/1979 | Crowder et al. | 427/42 |
| 4,329,706 | 5/1982 | Crowder et al. | 357/71 |
| 4,510,670 | 4/1985 | Schwabe et al. | 29/571 |

OTHER PUBLICATIONS

IBM Technical Disclosure Bulletin vol. 13, No.3, Aug. 1970, p. 646, Kircher et al., "Fabricating a Gate Field-Effect Transistor".

IBM Technical Disclosure Bulletin vol. 23, No. 6, Nov. 1980, pp. 2563–2566 Rideout "Method of Fabricating MOSFET . . . ".

Primary Examiner—Brian E. Hearn
Assistant Examiner—T. Quach
Attorney, Agent, or Firm—Douglas A. Sorensen; Robert Groover, III; Melvin Sharp

[57] ABSTRACT

Using a process in accordance with the teachings of this invention, an integrated circuit may be fabricated providing refractory metal silicide layers, such as TiSi$_2$, of differing thicknesses to provide optimal reductions in the sheet resistances of the regions in which refractory metal silicide layers are formed. In one embodiment of the present invention a field effect transistor having a polycrystalline silicon gate is fabricated to provide a gate having optimally minimized sheet resistance and source and drain regions having TiSi$_2$ layers of the appropriate thickness to avoid punch-through leakage problems.

18 Claims, 9 Drawing Figures

PROCESS FOR FORMING TISI₂ LAYERS OF DIFFERING THICKNESSES IN A SINGLE INTEGRATED CIRCUIT

FIELD OF THE INVENTION

This invention relates to the processes used in the fabrication of integrated circuits. More specifically this invention relates to a process for providing refractory metal silicide layers, such as TiSi$_2$, of optimal thickness in differing portions of the integrated circuit.

BACKGROUND OF THE INVENTION

The use of TiSi$_2$ to increase the conductivity of silicon and polycrystalline silicon areas is well known in the art. Field effect transistor 10 in FIG. 1 includes TiSi$_2$ layers 6, 7, and 8 which increase the conductivity of gate 4, source 2, and drain 3, respectively. TiSi$_2$ layers 6, 7, and 8 are formed using the direct reaction process. This process involves depositing a layer of titanium on the surace of transistor 10 and baking transistor 10 to cause the titanium layer to react with the silicon and polysilicon areas which are in contact with the titanium layer. The unreacted titanium is then removed.

The simple direct reaction process has critical limitations when used to form TiSi$_2$ layers in both a polysilicon layer and doped areas in a substrate when used in the fabrication of very large scale integrated circuits. In very large scale integrated circuits, doped regions generally have a depth of approximately 0.2 microns. Thus the titanium layer deposited on the surface of the integrated circuit must be limited to about 0.1 microns because the reacting titanium will diffuse into the doped region and 0.1 microns of titanium will produce a layer of TiSi$_2$ approximately 0.15 microns deep. If a thicker layer of titanium is used, the titanium disilicide layer may diffuse through (punch-through) the doped region to the substrate and thus cause excessive leakage current from the doped region to the substrate. However, to provide a TiSi$_2$ layer which reduces the sheet resistance of the polycrystalline silicon layer to a minimum (i.e. less than 1 ohm/sq.), a TiSi$_2$ layer of at least 0.15 microns of titanium is necessary. Thus using the prior art direct reaction method, the polycrystalline silicon regions cannot be provided with a TiSi$_2$ layer which minimizes the sheet resistance of the polycrystalline silicon layer in very large scale integrated circuits.

SUMMARY

Using a process in accordance with the teachings of this invention, an integrated circuit may be fabricated providing refractory metal silicide layers, such as TiSi$_2$, of differing thicknesses to provide optimal reductions in the sheet resistances of the regions in which refractory metal silicide layers are formed. In one embodiment of the present invention a field effect transistor having a polysilicon gate is fabricated to provide a gate having optimally minimized sheet resistance and source and drain regions having TiSi$_2$ layers of the appropriate thickness to avoid punch-through leakage problems.

DETAILED DESCRIPTION

Figure 1:
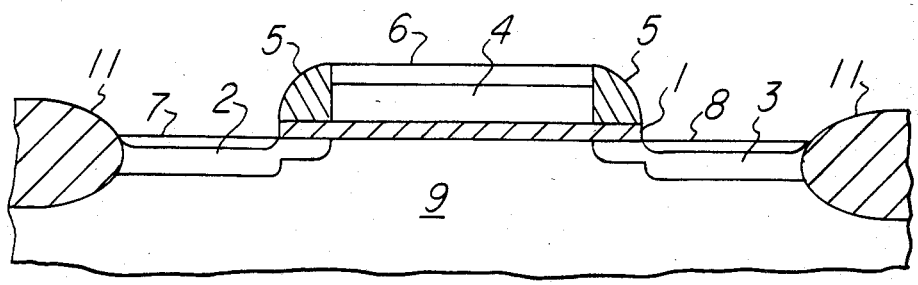
FIG. 1 is a cross-sectional diagram of a prior art field effect transistor including TiSi$_2$ layers in its gate, source and drain formed by the simple direct reaction process.
Figure 2A:
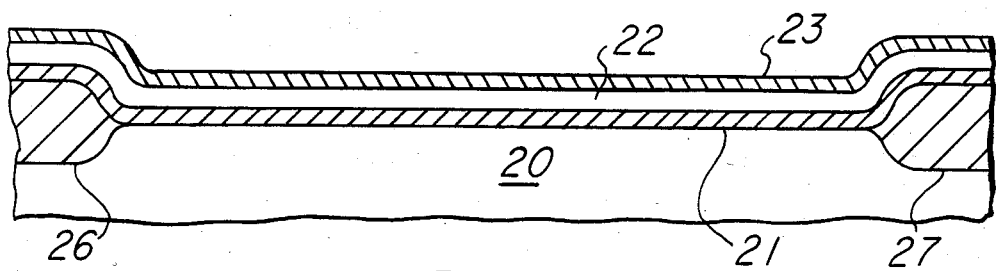
FIGS. 2a through 2h are cross-sectional diagrams illustrating the processing steps of one embodiment of the present invention.
Figure 2B:
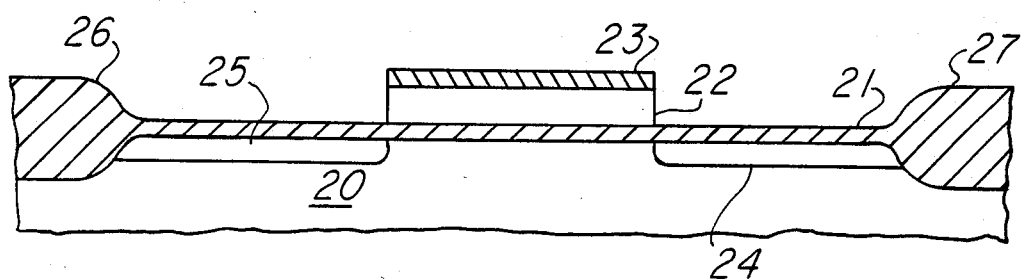
Figure 2C:
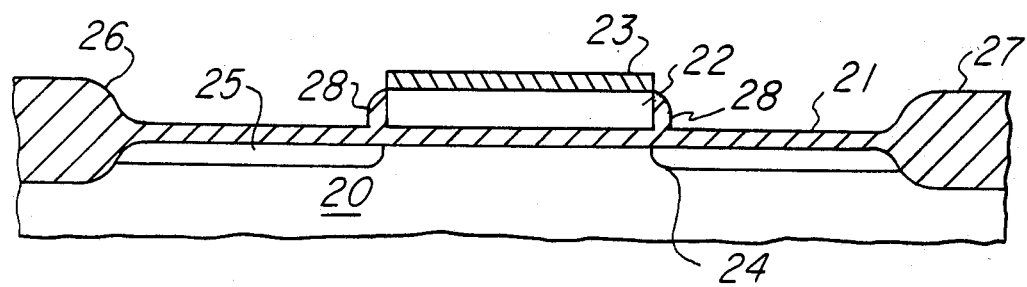

FIGS. 2a through 2h are cross-sectional diagrams depicting the processing steps of a preferred embodiment of this invention which are used to fabricate a field effect transistor. Field oxide regions 26 and 27 are grown using techniques well known in the art. On silicon substrate 20 a silicon dioxide layer having a thickness of 250 angstroms is formed by thermal oxidation at temperature of 900° C. for approximately 30 minutes. On the surface of silicon dioxide layer 21 a polycrystalline layer having a thickness of approximately 4,000 angstroms is deposited by low pressure chemical vapor deposition (LPCVD) at a temperature of 700° C. for approximately 30 minutes. On the surface of polycrystalline silicon layer 22 a silicon nitride layer having a thickness of approximately 150 angstroms is deposited by LPCVD at a temperature of 700° C. for approximately 5 minutes. Silicon nitride layer 23 and polycrystalline silicon layer 22 are patterned using photolithographic techniques well known in the art to provide the structure shown in FIG. 2b. Doped regions 24 and 25 are formed by an ion implantation through silicon dioxide layer 21 of arsenic ions having an energy of 60 kiloelectron-volts at a density of 10$^{14}$ ions/cm$^2$. This ion implantation is then driven in and annealed at a temperature of 900° C. for approximately 20 minutes. Sidewall silicon dioxide areas 28 of FIG. 2c are thermally grown in an oxygen ambient at a temperature of 900° C. for approximately 10 minutes. This thermal oxidation step also increases the thickness of silicon dioxide layer 21. It is critical that the thickness of silicon dioxide layer 21 is increased because a 250 anstrom layer of silicon dioxide is insufficient to prevent the formation of titanium silicide in doped regions 24 and 25 during the step which forms a titanium silicide layer in polycrystalline silicon gate 22 (described below). However, silicon dioxide layer 21 must be thin enough under polycrystalline silicon gate 22 for proper operation of the field effect transistor formed in the described embodiment of this invention.

Figure 2D:
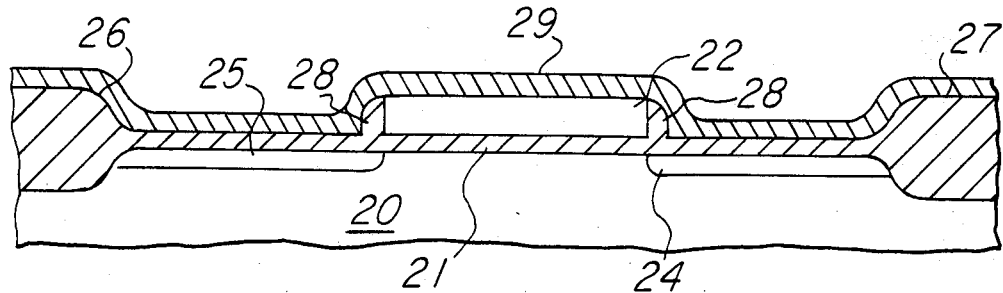
Figure 2E:
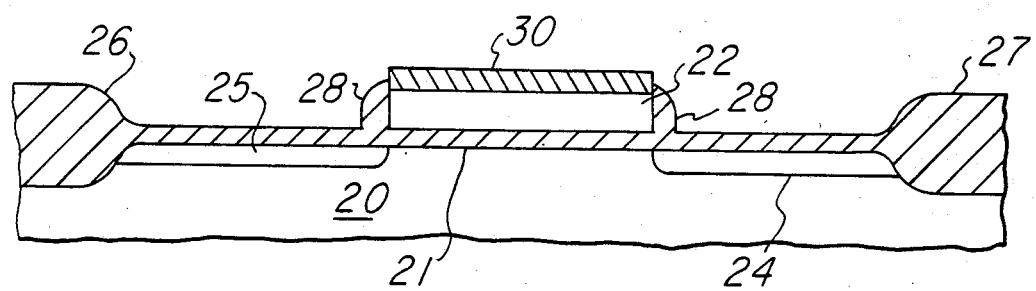

Silicon nitride layer 23 is removed using techniques well known in the art and titanium layer 29 is deposited by sputtering to a thickness of approximately 0.15 microns to provide the structure shown in FIG. 2d. Titanium layer 29 is preferably between 0.15 and 0.2 microns thick. This amount of titanium when reacted with polysilicon layer 22 will provide a sheet resistance in polysilicon layer 22 of less than 1 ohm/sq. Titanium layer 29 is reacted with polycrystalline silicon layer 22 by baking at a temperature approximately 675° C. for approximately 30 minutes. Titanium layer 29 will react with polycrystalline silicon layer 22 to form TiSi$_2$ and only with polycrystalline silicon layer 22 because all other areas of the integrated circuit formed in substrate 20 are covered by silicon dioxide which will not react with titanium layer 29. The unreacted titanium is then removed by using a mixture of hydrogen peroxide and sulphuric acid. The result is TiSi$_2$ layer 30 as shown in FIG. 2e.

Figure 2F:
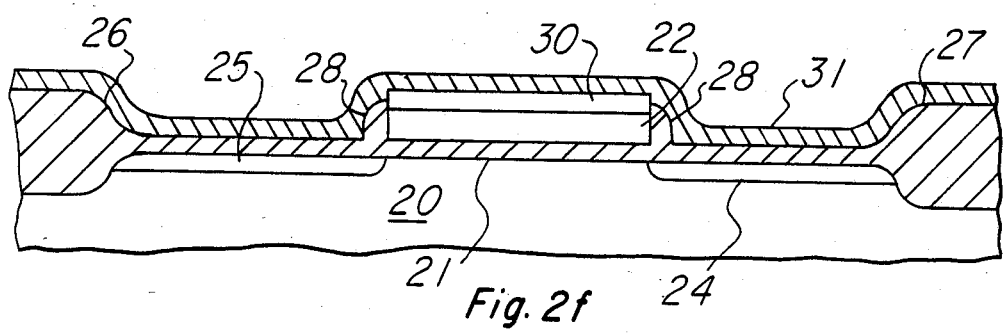

Oxide layer 31 in FIG. 2f is formed using low pressure chemical vapor deposition. Silicon dioxide layer 31 and silicon dioxide layer 21 are etched a highly anisotropic plasma etch. Source region 34 and drain region 35 are formed by implanting arsenic ions at an energy of 80 kiloelecton-volts at a density of $5 \times 10^{15}$ ions/cm$^2$ and driven in at a temperature of 975° C. for approximately 10 minutes.

The process described in the present embodiment provides source and drain areas having a stepped profile in a P-channel field effect transistor which provides preferred high voltage characteristics. Although the described embodiment includes a field effect transistor having stepped source and drain regions, the scope of this invention is clearly not limited to field effect transistors let alone field effect transistors with stepped source and drain regions.

Figure 2G:
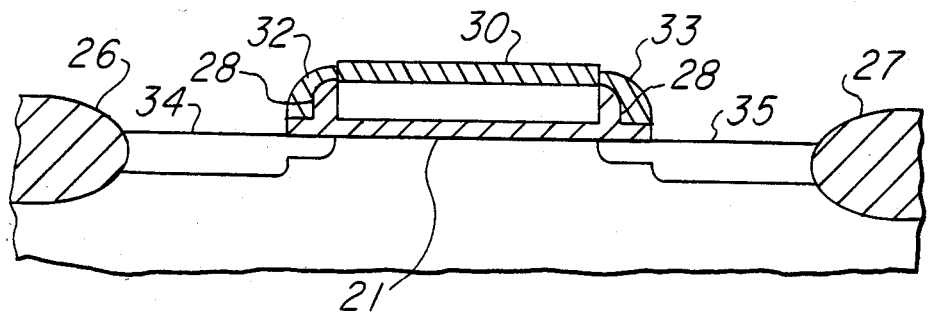
Figure 2H:
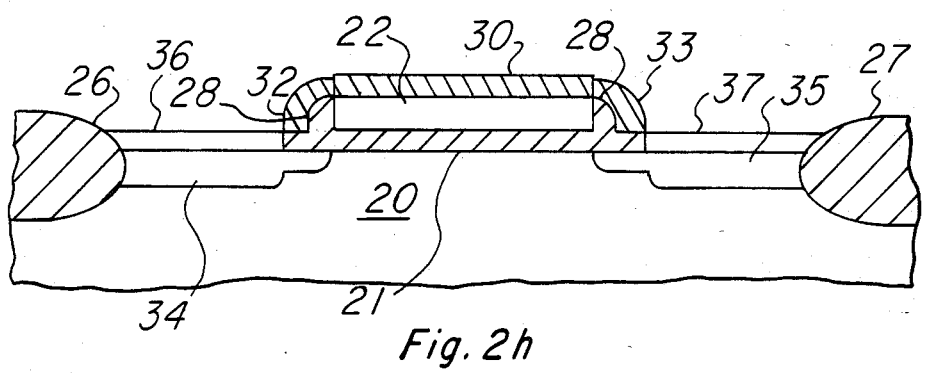

A layer of Ti (not shown) approximately 0.1 microns thick is then deposited on the surface of the structure of FIG. 2g and is reacted with source region 34 drain region 35 and polycrystalline silicon gate 22 at a temperature of 675° C. for approximately 30 minutes to provide TiSi$_2$ regions 36 and 37 and to increase the thickness TiSi$_2$ region 30 as shown in FIG. 2h. The thick sidewalls provided by sidewall silicon dioxide regions 28, 32, and 33 prevent a TiSi$_2$ conductor from forming between either TiSi$_2$ region 30 and TiSi$_2$ region 37 or TiSi$_2$ region 30 and TiSi$_2$ 36 and formation of such a conductor is futher prevented by using the process described in copending patent application Ser. No. 492,069, Method of Forming a Metallic Silicide, which is assigned to the assignee of this application. TiSi$_2$ regions 36 and 37 are preferrably formed from a titanium layer approximately 0.1 microns thick, thus preventing TiSi$_2$ layers 36 and 37 from punching through source region 34 and drain region 35 respectively to substrate 20.

Although specific embodiments of the present invention are described in the specification, it is not to be construed as limiting the scope of the invention. Other embodiments of the present invention will become apparent to those skilled in the art in light of the teachings of this specification.

We claim:

1. A process for forming refractory metal silicide layers in two regions of an integrated circuit, wherein the thickness of the layer of refractory metal silicide in a first region is different from the thickness of the refractory metal silicide layer in a second region, comprising the step of:

forming a first layer of silicon dioxide on said first region;

forming said second region on said first region of silicon dioxide;

forming a layer of silicon nitride on said second region;

patterning said second region and said layer of silicon nitride to the same pattern, thus providing a patterned second region having a layer of silicon nitride on the surface thereof;

forming a second layer of silicon dioxide on the exposed sidewalls of said patterned second region;

increasing the thickness of the portions of said first layer of silicon dioxide which are not covered by said patterned second layer;

removing said patterned layer of silicon nitride;

forming a first layer of refractory metal on said integrated circuit;

baking said integrated circuit thus causing said layer of refractory metal to react with the surface of said patterned second region to form refractory metal silicide;

removing the unreacted portion of said layer of refractory metal;

removing a portion of said first layer of silicon dioxide so that silicon dioxide remains on the sidewalls of said patterned second region and on those areas of said first region which will not receive a layer of refractory metal silicide;

forming a second layer of refractory metal on said integrated circuit;

baking said integrated circuit thus causing said second layer of refractory metal to react with the areas of said first region and said second region areas not covered by the remaining portion of said third layer of silicon dioxide and said first layer of silicon dioxide;

and removing the unreacted portion of said second layer of refractory metal.

2. A process as in claim 1, wherein said refractory metal is titanium.

3. A process as in claim 1, wherein said second layer of silicon dioxide is formed by thermal oxidation.

4. A process as in claim 1, wherein said first layer of refractory metal is deposited by sputtering.

5. A process as in claim 1, wherein said second layer of refractory metal is deposited by sputtering.

6. A process for forming refractory metal silicide layers in both the polycrystalline silicon layer and the substrate of an integrated circuit, wherein the thickness of the layer of refractory metal silicide in said polycrystalline silicon layer is different from the thickness of the refractory metal silicide layer in said substrate, comprising the steps of:

forming a first layer of silicon dioxide on said substrate;

forming a layer of polycrystalline silicon on said first layer of silicon dioxide;

forming a layer of silicon nitride on said layer of polycrystalline silicon;

patterning said layer of polycrystalline silicon and said layer of silicon nitride to the same pattern, thus providing a patterned layer of polycrystalline silicon havng a layer of silicon nitride on the surface thereof;

forming a second layer of silicon dioxide on the exposed sidewalls of said patterned layer of polycrystalline silicon;

increasing the thickness of the portions of said first layer of silicon dioxide which are not covered by said patterned polycrystalline silicon layer;

removing said patterned layer of silicon nitride;

forming a first layer of refractory metal on said integrated circuit;

baking said integrated circuit thus causing said layer of refractory metal to react with the surface of said patterned layer of polycrystalline silicon to form refractory metal silicide;

removing the unreacted portion of said layer of refractory metal;

removing a portion of said first layer of silicon dioxide so that silicon dioxide remains on the sidewalls if said patterned polycrystalline silicon layer and on those areas of said integrated circuit which will not receive a layer of refractory metal silicide;

forming a second layer of refractory metal on said integrated circuit;

baking said integrated circuit thus causing said second layer of refractory metal to react with the areas of said substrate and said polycrystalline silicon areas not covered by the remaining portion of said third layer of silicon dioxide and said first layer of silicon dioxide; and removing the unreacted portion of said second layer of refractory metal.

7. A process as in claim 6, wherein said refractory metal is titanium.

8. A process as in claim 6, wherein said second layer of silicon dioxide is formed by thermal oxidation.

9. A process as in clam 6, wherein said first layer of refractory metal is deposited by sputtering.

10. A process as in claim 6, wherein said second layer of refractory metal is deposited by sputtering.

11. A process for forming refractory metal silicide layers in both the polycrystalline silicon layer and the substrate of an integrated circuit, wherein the thickness of the layer of refractory metal silicide in said polycrystalline silicon layer is different from the thickness of the refractory metal silicide layer in said substrate, comprising the steps of:

forming a first layer of silicon dioxide on said substrate;

forming a layer of polycrystalline silicon on said first layer of silicon dioxide;

forming a layer of silicon nitride on said layer of polycrystalline silicon;

patterning said layer of polycrystalline silicon and said layer of silicon nitride to the same pattern, thus providing a patterned layer of polycrystalline silicon having a layer of silicon nitride on the surface thereof;

forming a second layer of silicon dioxide on the exposed sidewalls of said patterned layer of polycrystalline silicone;

removing said patterned layer of silicon nitride;

forming a first layer of refractory metal on said integrated circuit;

baking said integrated circuit thus causing said layer of refractory metal to react with the surface of said patterned layer of polycrystalline silicon to form refractory metal silicide;

removing the unreacted portion of said layer of refractory metal;

forming a third layer of silicon dioxide on said integrated circuit; removing a portion of said third layer of silicon dioxide and said first layer of silicon dioxide so that silicon dioxide remains on the sidewalls of said patterned polycrystalline silicon layer and on those areas of said integrated circuit which will not receive a layer of refractory metal silicide;

forming a second layer of refractory metal on said integrated circuit;

baking said integrated circuit thus causing said second layer of refractory metal to react with the areas of said substrate and said polycrystalline silicon areas not covered by the remaining portion of said third layer of silicon dioxide and said first layer of silicon dioxide; and removing the unreacted portion of said second layer of refractory metal.

12. A process as in claim 11, wherein said refractory metal is titanium.

13. A process as in claim 11, wherein said third layer of silicon dioxide is deposited using low pressure chemical vapor deposition.

14. A process as in claim 11, wherein said first layer of refractory metal is deposited by sputtering.

15. A process as in claim 11, wherein said second layer of refractory metal is deposited by sputtering.

16. A process as in claim 11, wherein said second layer of silicon dioxide is formed by thermal oxidation.

17. A process for forming refractory metal silicide layers in both the polycrystalline silicon gate and the source and drain regions of a field effect transistor, wherein the thickness of the layer of refractory metal silicide in said polycrystalline silicon gate is different from the thickness of the refractory metal silicide layer in said source and drain regions, comprising the steps of:

forming a first layer of silicon dioxide on said substrate;

forming a layer of polycrystalline silicon on said first layer of silicon dioxide;

forming a layer of silicon nitride on said layer of polycrystalline silicon;

patterning said layer of polycrystalline silicon and said layer of silicon nitride to the same pattern, thus providing a patterned gate of polycrystalline silicon having a layer of silicon nitride on the surface thereof;

forming a second layer of silicon dioxide on the exposed sidewalls of said patterned gate of polycrystalline silicon;

forming a field oxide surrounding the area of said substrate in which said field effect transistor wil be formed;

removing said patterned layer of silicon nitride; forming a first layer of refractory metal on said integrated circuit;

baking said integrated circuit thus causing said layer of refractory metal to react with the surface of said patterned layer of polycrystalline silicon to form refractory metal silicide;

removing the unreacted portion of said layer of refractory metal;

removing a portion of said first and second layers of silicon dioxide so that silicon dioxide remains on the sidewalls of said patterned polycrystalline silicon layer and on those areas of said integrated circuit which will not receive a layer of refractory metal silicide;

implanting and driving in dopant ions into said substrate to form said source and said drain regions;

forming a second layer of refractory metal on said integrated circuit;

baking said integrated circuit thus causing said second layer of refractory metal to react with said gate, source and drain regions; and removing the remaining portions of said second layer of refractory metal.

18. A process as in claim 17, wherein said first layer of refractory metal is deposited by sputtering.

* * * * *